United States Patent [19]

Fiordalice et al.

[11] Patent Number: 5,420,072
[45] Date of Patent: May 30, 1995

[54] METHOD FOR FORMING A CONDUCTIVE INTERCONNECT IN AN INTEGRATED CIRCUIT

[75] Inventors: Robert W. Fiordalice; Johnson O. Olowolafe; Hisao Kawasaki, all of Austin, Tex.

[73] Assignee: Motorola, Inc., Schaumburg, Ill.

[21] Appl. No.: 191,896

[22] Filed: Feb. 4, 1994

[51] Int. Cl.⁶ ............................................. H01L 21/283
[52] U.S. Cl. ..................................... 437/192; 437/190; 437/246; 427/126.1
[58] Field of Search ............... 437/192, 246, 190, 195; 427/255.2, 126.1, 99, 97

[56] References Cited

U.S. PATENT DOCUMENTS

| | | | |
|---|---|---|---|
| 4,884,123 | 11/1989 | Dixit et al. | 437/192 |
| 4,897,709 | 1/1990 | Yokoyama et al. | |
| 5,242,860 | 9/1993 | Nulman et al. | 437/190 |
| 5,296,404 | 3/1994 | Akahori et al. | 473/173 |

OTHER PUBLICATIONS

M. Kageyama et al., "Formation of Texture Controlled Aluminum and its Migration Performance . . . ;" 29th Annual Proceedings Reliability Physics Apr. 1991, pp. 97–101.

T. Kaizuka et al., "AL(111)/CVD–TiN(111) Stacked Film Formation Technique with High Aspect . . . ", Ext. Abstracts of the 1993 Internat'l Conf. on Solid State Devices and Materials, pp. 555–557 (published month not shown).

N. Yokoyama et al., "LPCVD Titanium Nitride for ULSIs," Journal of the Electrochemical Society, vol. 138, No. 1, Jan. 1991, pp. 190–195.

M. J. Buting et al., "Relationship Between the Process Parameters and ilm Properties" . . . Journal of the Electrochemical Society, vol. 139, No. 9, Sep. 1992, pp. 2580–2584.

E. O. Travis et al., "A Scalable Submicron Contact Technology Using Conformal LPCVD TiN," Proceedings of the International Electron Devices Meeting, Dec. 1990, pp. 47–50.

*Primary Examiner*—T. N. Quach
*Attorney, Agent, or Firm*—Kent J. Cooper

[57] ABSTRACT

A conformal titanium nitride film having a preferred <111> crystal orientation is formed by chemically vapor depositing the film in two separate steps. In the first deposition step a titanium nitride layer (22) having poor step coverage and a preferred <111> crystal orientation is formed. In the second deposition step a second conformal layer of titanium nitride (24) is insitu deposited onto the first titanium nitride layer (22), wherein during the deposition the first titanium nitride layer (22) acts as a crystallographic seed layer for the second titanium nitride layer (24). As a result, a titanium nitride layer exhibiting a preferred <111> crystal orientation and good step coverage is achieved.

20 Claims, 2 Drawing Sheets

METHOD FOR FORMING A CONDUCTIVE INTERCONNECT IN AN INTEGRATED CIRCUIT

FIELD OF THE INVENTION

This invention relates generally to semiconductor devices, and more specifically to a method for forming a conductive interconnect in an integrated circuit.

BACKGROUND OF THE INVENTION

In the past, sputtered layers of titanium nitride have been used in integrated circuits as barrier layers for contacts and vias. Continued scaling of device dimensions, however, has also increased the aspect ratio of contacts and vias within high density integrated circuits. More specifically, contact and via depths within these integrated circuits have been increased, while at the same time their respective widths have also been decreased. Sputter deposited titanium nitride, however, is not very conformal and its step coverage within high aspect ratio contacts and vias is poor, and as a result unacceptably thin or discontinuous titanium nitride barrier layers are formed within contacts and vias having high aspect ratios. Consequently, the reliability of high density integrated circuits fabricated with sputter deposited titanium nitride barrier layers and high aspect ratio contacts and vias is also poor.

One technique that has been proposed for improving the step coverage of titanium nitride barrier layers is to deposit them by chemical vapor deposition. Using titanium tetrachloride and ammonia, titanium nitride films can be chemically vapor deposited to have preferred crystallographic orientations of either <111> or <200>. Titanium nitride films deposited with a preferred <200> crystal orientation are highly conformal, and therefore the step coverage of these films within high aspect ratio contacts and vias is good. Titanium nitride films deposited with a preferred <111> crystal orientation, however, are less conformal and as a result the step coverage of these films within high aspect ratio contacts and vias is less than desirable. Aluminum interconnects subsequently fabricated with a <111> titanium nitride barrier layer, however, have a higher electromigration resistance than those fabricated with a <200> titanium nitride barrier layer. Therefore, the current methods used to form chemically vapor deposited titanium nitride barrier layers are unable to satisfy both the step coverage and electromigration requirements of high density integrated circuits. Accordingly, a need exists for a conformal titanium nitride film that can be used to form metal interconnects with improved electromigration resistance.

SUMMARY OF THE INVENTION

The previously mentioned problems with existing interconnects formed with chemically vapor deposited titanium nitride are overcome by the present invention. In one embodiment of the invention a conductive interconnect is formed in an integrated circuit by providing an integrated circuit structure. A first layer of titanium nitride is then chemically vapor deposited overlying the integrated circuit structure, and the first layer of titanium nitride has a preferred <111> crystal orientation. A second layer of titanium nitride is then chemically vapor deposited overlying the first layer of titanium nitride, wherein the first titanium nitride layer serves as a crystallographic seed layer for the second layer of titanium nitride and the second layer of titanium nitride has a preferred <111> crystal orientation. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
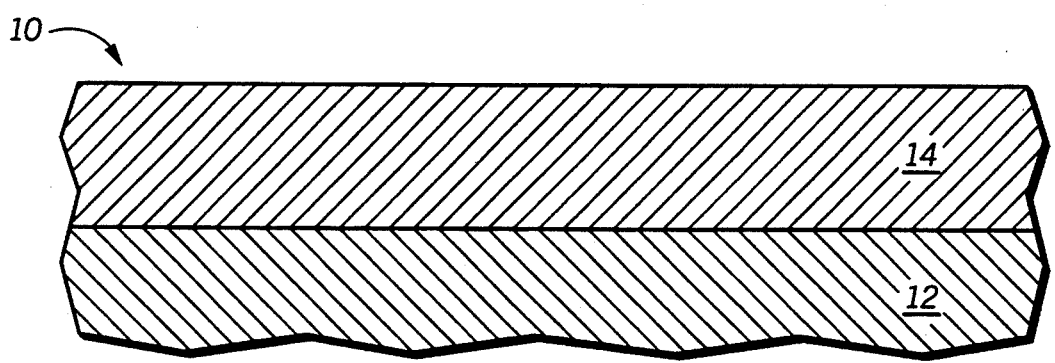
FIGS. 1-6 illustrate, in cross-section, process steps in accordance with one embodiment of the invention.

FIGS. 1 through 6 illustrate, in cross section, process steps in accordance with one embodiment of the invention, wherein a conductive interconnect is formed in an integrated circuit. Shown in FIG. 1 is a portion 10 of an integrated circuit structure, wherein the integrated circuit structure comprises a dielectric layer 14 overlying a conductive region 12. Conductive region 12 may be a patterned or unpatterned metal layer, a patterned or unpatterned metal nitride layer, a patterned or unpatterned metal silicide layer, a patterned or unpatterned doped polysilicon layer, or a combination thereof. In addition, conductive region 12 may also be a doped well region, or a doped source or drain region formed within a semiconductive substrate, such as a monocrystalline silicon substrate, a silicon on insulator substrate, a silicon on sapphire substrate, or the like. Dielectric layer 14 may be doped or undoped 0 silicon dioxide, silicon nitride, or the like. Conductive region 12 may be formed using conventional techniques, such as sputter deposition, chemical vapor deposition, ion implantation, plasma etching, rapid thermal annealing, photolithography, et cetera. Dielectric layer 14 may be formed using conventional techniques such as chemical vapor deposition, spin-on deposition, plasma-enhanced chemical vapor deposition, electron cyclotron resonance deposition, or the like.

Figure 2:
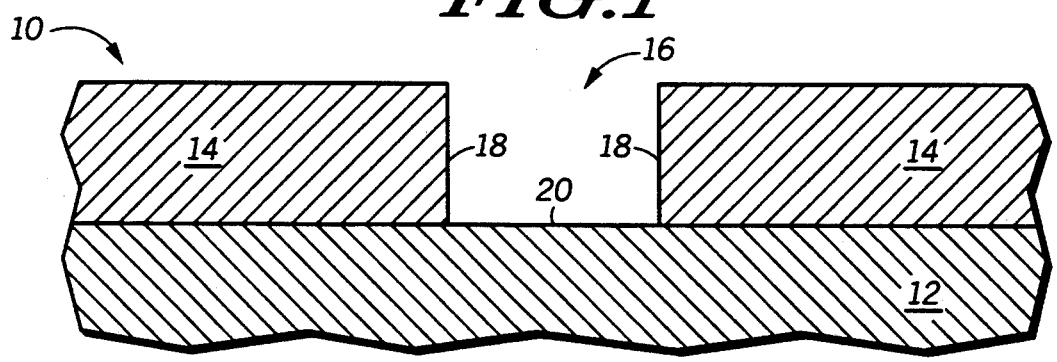

In FIG. 2, dielectric layer 14 is patterned using standard photolithographic patterning and etching techniques to define an opening 16 within dielectric layer 14 that has a sidewall 18. In addition, the patterning process also forms an exposed portion 20 of conductive region 12 within opening 16. It should be noted that the term opening, as used herein, includes a contact opening, a via opening, a through-hole, or the like.

Figure 3:
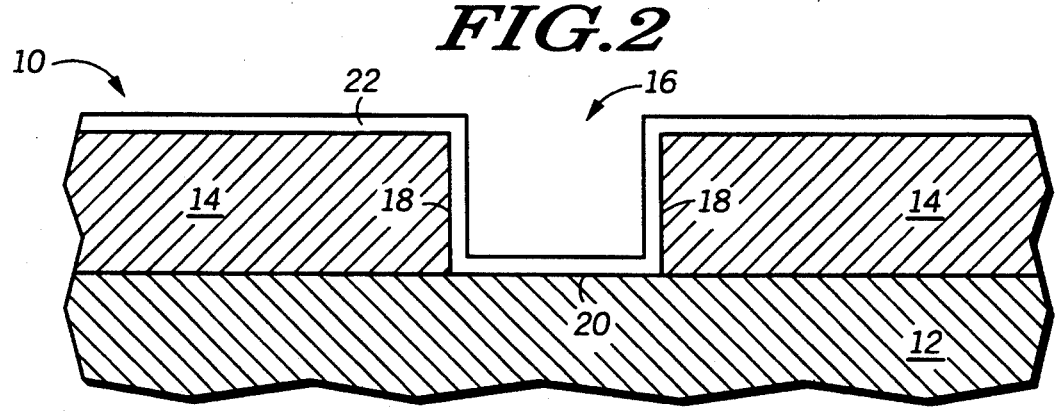

In FIG. 3, a first layer of titanium nitride 22, having a preferred <111> crystal orientation, is chemically vapor deposited to overlie the integrated circuit structure, and is deposited within opening 16, such that it lies adjacent to sidewall 18 and it overlies exposed portion 20 of conductive region 12. First titanium nitride layer 22 preferably has a thickness ranging from 5 to 100 nanometers. In a preferred embodiment, first titanium nitride layer 22 is deposited using a deposition ambient comprising titanium tetrachloride ($TiCl_4$), ammonia ($NH_3$), nitrogen ($N_2$), and argon (Ar). Alternatively, diluent gases other than nitrogen and argon, such as hydrogen, may also be used. First titanium nitride layer 22 may be deposited at a deposition pressure ranging from 10 millitorr to 100 Torr, a deposition temperature ranging from 300 to 800 degrees Celsius, a titanium tetrachloride partial pressure ranging from 0.01 to 0.50 millitorr, and an ammonia partial pressure ranging from 5 millitorr to 100 Torr. It is important to appreciate that titanium nitride films formed with this chemistry have a crystallographic orientation, which is dependent on titanium tetrachloride partial pressure, and that as the partial pressure of the titanium tetrachloride is reduced the preferred crystal orientation of the deposited titanium nitride film changes from <200> to <111>. Accordingly, first titanium nitride layer 22 is deposited with a titanium tetrachloride partial pressure that results in it being deposited with a preferred <111> crystal orientation. For example, titanium nitride films having a preferred <111> crystal orientation may be deposited in a deposition system having a reactor volume of approximately 3680 cubic centimeters under the following conditions: a titanium tetrachloride partial pressure of approximately 0.05 millitorr, an ammonia partial pressure of approximately 30 millitorr, a nitrogen diluent flow rate of approximately 150 sccm, an argon diluent flow rate of approximately 10 sccm, a deposition pressure of approximately 150 millitorr, and a deposition temperature of approximately 470 degrees Celsius. Although it is not illustrated in FIG. 3, a contacting layer of conductive material, such as titanium, tungsten, cobalt, tantalum or molybdenum may also be formed within opening 16, prior to depositing first titanium nitride layer 22, using conventional sputter deposition techniques or chemical vapor deposition techniques. In addition, a titanium nitride layer having a preferred <111> crystal orientation, as used herein, is a layer that is analyzed by x-ray diffraction and found to have a preferred <111> crystal orientation, as compared to x-ray diffraction data for a titanium nitride powder.

Figure 4:
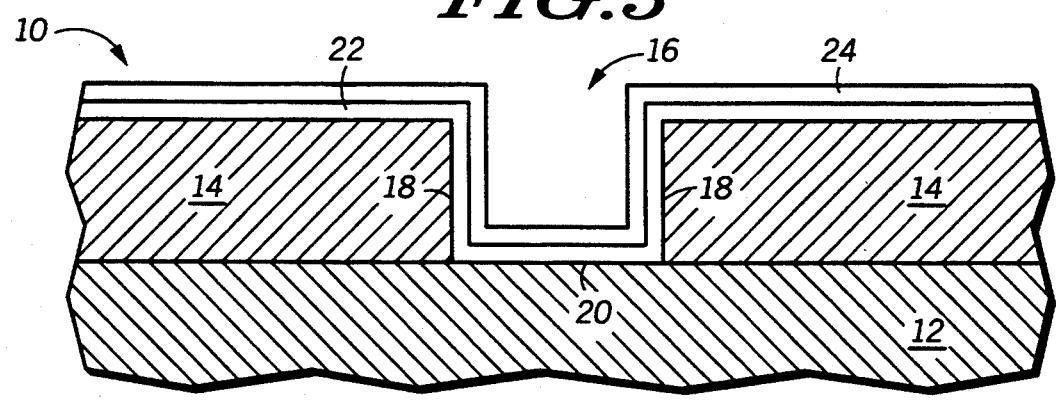

In FIG. 4, a second layer of titanium nitride 24, having a preferred <111> crystal orientation, is then deposited to overlie first titanium nitride layer 22. Second titanium nitride layer 24 preferably has a thickness ranging from 5 to 100 nanometers. In a preferred embodiment second titanium nitride layer 24 is deposited insitu with first titanium nitride layer 22. More specifically, first titanium nitride layer 22 is not removed from the deposition system and exposed to air before second titanium nitride layer 24 is deposited. Second titanium nitride layer 24 is also preferably deposited using a deposition ambient comprising titanium tetrachloride, ammonia, nitrogen, and argon. Once again, diluent gases other than nitrogen and argon, such as hydrogen, may also be used. The deposition conditions used to deposit second titanium nitride layer 24, however, are different from those used to deposit first titanium nitride layer 22. More specifically, titanium nitride layer 24 is deposited using deposition conditions which would normally result in the formation of a conformal titanium nitride film having a preferred <200> crystal orientation. First titanium nitride layer 22, however, acts as a crystallographic seed layer during the deposition of second titanium nitride layer 24, and as a result second titanium nitride layer 24 is conformally deposited having a preferred <111> crystal orientation. Second titanium nitride layer 24 may be deposited using a deposition pressure ranging from 10 millitorr to 100 Torr, a deposition temperature ranging from 300 to 800 degrees Celsius, a titanium tetrachloride partial pressure ranging from 1.0 to 100 millitorr, and an ammonia partial pressure ranging from 10 to 300 millitorr. The partial pressure of the titanium tetrachloride used to deposit a titanium nitride layer also effects the conformality of that layer. Accordingly, second titanium nitride layer 24 is deposited using a titanium tetrachloride partial pressure that results in it being conformally deposited. For example, it may be conformally deposited in a deposition system having a reactor volume of approximately 3680 cubic centimeters under the following conditions: a titanium tetrachloride partial pressure of approximately 11 millitorr, an ammonia partial pressure of approximately 30 millitorr, a nitrogen diluent flow rate of approximately 150 sccm, and an argon diluent flow rate of approximately 10 sccm, a deposition pressure of approximately 150 millitorr, and a deposition temperature of approximately 470 degrees Celsius.

Figure 5:
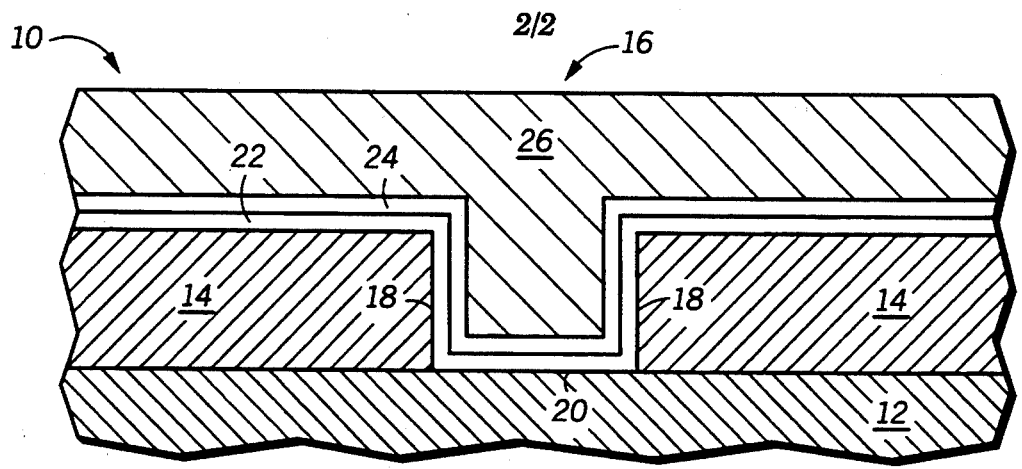

In FIG. 5, a conductive layer 26 of material is then formed such that it overlies second titanium nitride layer 24 and lies within contact opening 16. Conductive layer 26 may be formed using conventional sputter or chemical vapor deposition techniques, and preferably comprises aluminum with a preferred <111> crystal orientation. It is important to note that the crystal orientation of aluminum deposited onto a titanium nitride layer can be effected by the crystal structure of the underlying titanium nitride layer. This is because the underlying titanium nitride layer may act as a crystallographic seed layer for the overlying aluminum. Therefore, since titanium nitride layer 24 has a preferred <111> crystal orientation an aluminum or an aluminum-alloy subsequently deposited on it may also be formed to have a preferred <111> crystal structure. Conductive layer 26 may be an aluminum layer or an aluminum-alloy layer such as, aluminum-silicon, aluminum-copper, aluminum-silicon-copper, aluminum-nickel-chrome, or the like. Alternatively, conductive layer 26 may also be another conductive material such as tungsten, molybdenum, polysilicon, or copper.

Figure 6:
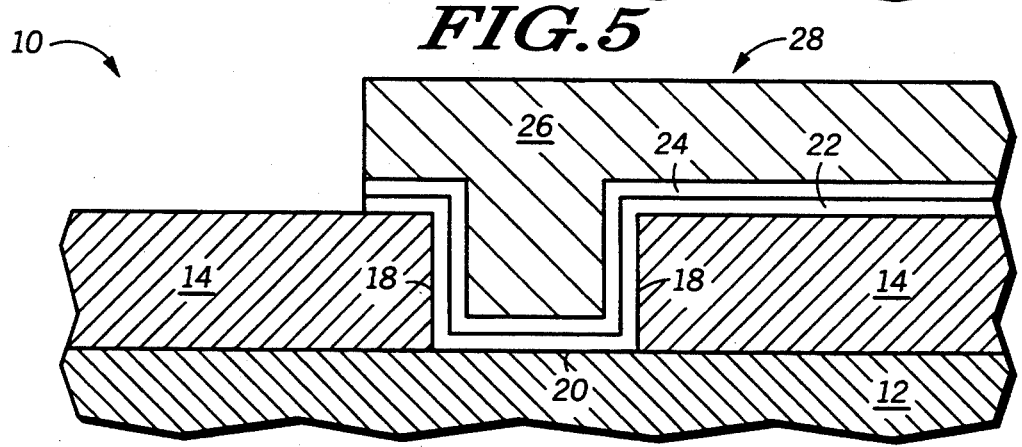

In FIG. 6, conductive layer 26, second titanium nitride layer 24, and first titanium nitride layer 22, are then patterned using standard photolithographic patterning and etching processes to form a conductive interconnect 28. It should be appreciated that interconnects comprising <111> aluminum and <111> titanium nitride have improved electromigration resistance over those fabricated with <200> aluminum and <200> titanium nitride. Therefore, with this invention aluminum interconnects having improved electromigration resistance may be fabricated.

Figure 7:
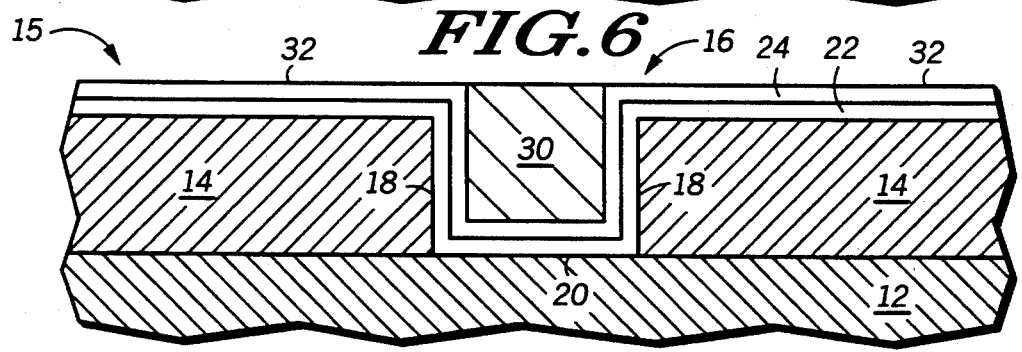
FIGS. 7-8 illustrates, in cross-section, process steps in accordance with an alternative embodiment of the invention, wherein like reference numerals designate identical or corresponding parts throughout the several views.
Figure 8:
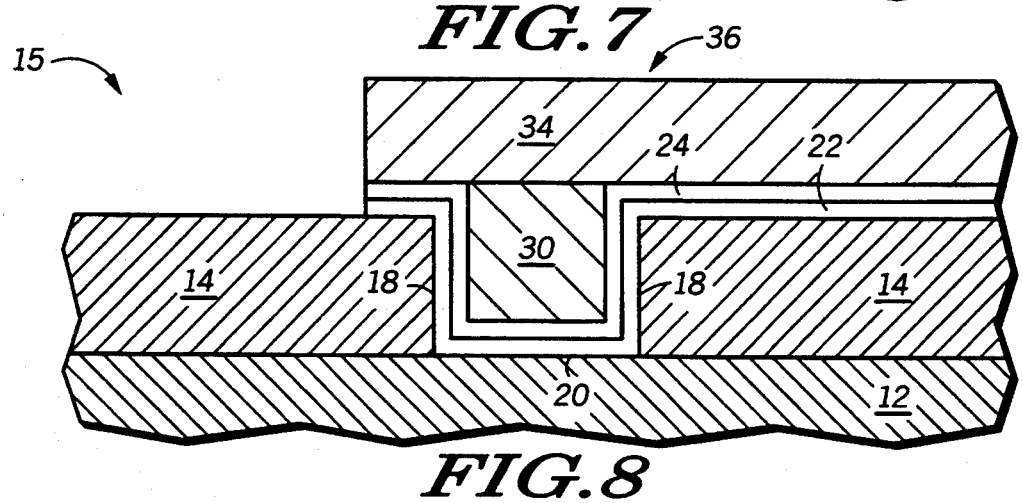

FIGS. 7 through 8 illustrate, in cross-section, process steps in accordance with an alternative embodiment of the invention wherein a conductive interconnect is formed in an integrated circuit. Shown in FIG. 7 is a portion 15 of an integrated circuit structure that is analogous to that shown in FIG. 4, wherein after second titanium nitride layer 24 has been deposited a conductive plug 30 is formed within contact opening 16. In one embodiment conductive plug 30 is formed by chemically vapor depositing a layer of tungsten over second titanium nitride layer 24 such that contact opening 16 is substantially filled. A portion of the tungsten layer is then selectively removed such that conductive plug 30 is formed and a portion 32 of second titanium nitride layer 24 is exposed. Conductive plug 32 may be formed using standard plasma etching techniques. Alternatively, chemical mechanical polishing or a combination of chemical mechanical polishing and standard plasma etching techniques may be used to form conductive plug 30. In addition, conductive plug 30 may also be formed with other conductive materials such as molybdenum, polysilicon, or copper.

In FIG. 8, a conductive layer 34 is formed overlying conductive plug 30 and exposed portion 32 of second titanium nitride layer 24. Conductive layer 26 may be formed using conventional sputter or chemical vapor deposition techniques, and preferably comprises aluminum with a preferred <111> crystal orientation. As previously explained, the crystal orientation of aluminum deposited onto a titanium nitride layer is effected by the crystal structure of the underlying titanium nitride layer. Therefore, since titanium nitride layer 24 has a preferred <111> crystal orientation an aluminum or an aluminum-alloy subsequently deposited on it may also be formed to have a preferred <111> crystal structure. Conductive layer 26 may be an aluminum layer or an aluminum-alloy layer such as, aluminum-silicon, aluminum-copper, aluminum-silicon-copper, aluminum-nickel-chrome, or the like. Alternatively, conductive layer 34 may be another conductive material such as tungsten, molybdenum, polysilicon, or copper. After deposition, conductive layer 34, second titanium nitride layer 24, and first titanium nitride layer 22 are patterned using standard photolithographic patterning and etching techniques to form an interconnect 36. As previously discussed, interconnects comprising <111> aluminum and <111> titanium nitride have improved electromigration resistance over those fabricated with <200> aluminum and <200> titanium nitride. Therefore, with this invention aluminum interconnects having improved electromigration resistance may be fabricated.

The foregoing description and illustrations contained herein demonstrate many of the advantages associated with the present invention. In particular, a conformal titanium nitride film having a preferred <111> crystal orientation may be formed by chemically vapor depositing the film in two separate steps. In the first deposition step a titanium nitride layer having poor step coverage and a preferred <111> crystal orientation is formed. In the second deposition step a second conformal layer of titanium nitride is insitu deposited onto the first titanium nitride layer, wherein during the deposition the first titanium nitride layer acts as a crystallographic seed layer for the second titanium nitride layer. As a result, a titanium nitride layer exhibiting a preferred <111> crystal orientation and good step coverage is achieved. Moreover, aluminum interconnects subsequently formed with the <111> titanium nitride layer may be formed such that the aluminum has a preferred <111> crystal orientation. Therefore, the electromigration resistance of the aluminum interconnect is improved.

Thus it is apparent that there has been provided, in accordance with the invention, a method for forming a conductive interconnect in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to contacts or vias that have high aspect ratios. Moreover, the invention is not limited to the formation of titanium nitride barrier layers in contacts and vias. Titanium nitride local interconnects may also be formed with this invention. It is also important to note that the present invention is not limited in any way to a specific aluminum alloy. Therefore, it is intended that this invention encompass all such variations and modifications as fall within the scope of the appended claims.

I claim:

1. A method for forming a conductive interconnect comprising the steps of:
   providing an integrated circuit structure;
   chemically vapor depositing a first layer of titanium nitride with a first deposition process, wherein the first layer of titanium nitride overlies the integrated circuit structure and has a preferred <111> crystal orientation; and
   chemically vapor depositing a second layer of titanium nitride overlying the first layer of titanium nitride with a second deposition process, wherein the second deposition process differs from the first deposition process and the first layer of titanium nitride serves as a crystallographic seed layer for the second layer of titanium nitride and the second layer of titanium nitride has a preferred <111> crystal orientation.

2. The method of claim 1, further comprising the step of depositing a conductive layer of material overlying the second layer of titanium nitride.

3. The method of claim 2, wherein the step of depositing the conductive layer of material is further characterized as depositing a layer comprising aluminum.

4. The method of claim 3, wherein the step of depositing the layer comprising aluminum is further characterized as depositing the layer comprising aluminum to have a preferred <111> crystal orientation.

5. The method of claim 2, wherein the step of depositing the conductive layer of material is further characterized as depositing a layer of tungsten.

6. The method of claim 1, wherein the step of chemical vapor depositing the first layer of titanium nitride with the first deposition process is further characterized as depositing the first layer of titanium nitride with a deposition ambient comprising titanium tetrachloride and ammonia, wherein the titanium tetrachloride has a first partial pressure.

7. The method of claim 6, wherein the step of chemical vapor depositing the second layer of titanium nitride with the second deposition process is further characterized as depositing the second layer of titanium nitride with a deposition ambient comprising titanium tetrachloride and ammonia, wherein the titanium tetrachloride has a second partial pressure.

8. The method of claim 7, wherein the second partial pressure is greater than the first partial pressure.

9. The method of claim 1, wherein the step of chemical vapor depositing the second layer of titanium nitride is further characterized as depositing the second layer of titanium nitride insitu with the first layer of titanium nitride.

10. A method for forming a conductive interconnect comprising the steps of:
   providing an integrated circuit structure;
   chemically vapor depositing a first layer of titanium nitride with a first deposition ambient comprising titanium tetrachloride and ammonia, wherein: the first layer of titanium nitride overlies the integrated circuit structure and has a preferred <111> crystal orientation and the first deposition ambient has a first titanium tetrachloride partial pressure; and chemically vapor depositing a second layer of titanium nitride overlying the first layer of titanium nitride with a second deposition ambient comprising titanium tetrachloride and ammonia, the second deposition ambient having a second titanium tetrachloride partial pressure, wherein the second titanium tetrachloride partial pressure is greater than the first titanium tetrachloride partial pressure and the first layer of titanium nitride serves as a crystallographic seed layer for the second layer of titanium nitride and the second layer of titanium nitride has a preferred <111> crystal orientation.

11. The method of claim 10, further comprising the step of depositing a conductive layer of material overlying the second layer of titanium nitride.

12. The method of claim 11, wherein the step of depositing the conductive layer of material is further characterized as depositing a layer comprising aluminum.

13. The method of claim 12, wherein the step of depositing the layer comprising aluminum is further characterized as depositing the layer comprising aluminum with a preferred <111> crystal orientation.

14. The method of claim 11, wherein the step of depositing the conductive layer of material is further characterized as depositing a layer of tungsten.

15. A method for forming a conductive interconnect in an integrated circuit comprising the steps of:

providing an integrated circuit structure, the integrated circuit structure comprising a dielectric layer overlying a conductive region;

patterning the dielectric layer to form an opening and to form an exposed portion of the conductive region;

chemically vapor depositing a first layer of titanium nitride within the opening using a first deposition ambient comprising titanium tetrachloride and ammonia, wherein the first layer of titanium nitride has a preferred <111> crystal orientation and the first deposition ambient has a first titanium tetrachloride partial pressure; and chemically vapor depositing a second layer of titanium nitride overlying the first layer of titanium nitride using a second deposition ambient comprising titanium tetrachloride and ammonia, the second deposition ambient having a second titanium tetrachloride partial pressure, wherein the second titanium tetrachloride partial pressure is greater than the first titanium tetrachloride partial pressure and the first layer of titanium nitride serves as a crystallographic seed layer for the second layer of titanium nitride and the second layer of titanium nitride has a preferred <111> crystal orientation.

16. The method of claim 15, further comprising the step of depositing a first conductive layer of material overlying the second layer of titanium nitride.

17. The method of claim 16, wherein the step of depositing the first conductive layer of material is further characterized as depositing a layer comprising aluminum.

18. The method of claim 16, wherein the step of depositing the first conductive layer of material is further characterized as depositing a layer of tungsten.

19. The method of claim 18, further comprising the step of forming a tungsten plug within the opening.

20. The method of claim 19, further comprising the step of depositing a second conductive layer of material overlying the tungsten plug.

* * * * *